United States Patent [19]
Balsells

[11] Patent Number: 5,599,027
[45] Date of Patent: Feb. 4, 1997

[54] GASKET ASSEMBLY FOR SEALING ELECTROMAGNETIC WAVES

[75] Inventor: Peter J. Balsells, Santa Ana, Calif.

[73] Assignee: Bal Seal Engineering Company, Inc., Santa Ana, Calif.

[21] Appl. No.: 460,182

[22] Filed: Jun. 2, 1995

Related U.S. Application Data

[62] Division of Ser. No. 74,384, Jun. 11, 1993, Pat. No. 5,474, 309.

[51] Int. Cl.$^6$ .................................................. F16J 15/08
[52] U.S. Cl. .......................... 277/163; 277/172; 267/1.5; 174/35 GC
[58] Field of Search .................................. 277/163, 164, 277/170, 171, 172, 235 R, 168; 267/1.5, 166, 180; 174/35 GC, 35 MS, 35 R

[56] References Cited

U.S. PATENT DOCUMENTS

| | | | |
|---|---|---|---|
| 2,186,664 | 1/1940 | Brown | 277/172 |
| 3,042,417 | 7/1962 | Derman et al. | 277/172 |
| 3,542,379 | 11/1970 | Woodling | 277/172 |
| 4,710,590 | 12/1987 | Ekdahl | 174/35 GC |
| 4,788,381 | 11/1988 | Nilsson | 174/35 GC |
| 4,934,666 | 6/1990 | Balsells | 267/1.5 |
| 5,072,070 | 12/1991 | Balsells | 174/35 GC |
| 5,139,276 | 8/1992 | Balsells | 277/163 |
| 5,161,806 | 11/1992 | Balsells | 267/1.5 |

FOREIGN PATENT DOCUMENTS

| | | | |
|---|---|---|---|
| 4220765 | 1/1993 | Germany | 277/172 |
| 474055 | 10/1937 | United Kingdom | 277/172 |
| 1093530 | 12/1967 | United Kingdom | 277/27 |

*Primary Examiner*—William A. Cuchlinski, Jr.
*Assistant Examiner*—John L. Beres
*Attorney, Agent, or Firm*—Walter A. Hackler

[57] ABSTRACT

A gasket assembly for sealing electromagnetic waves includes a canted-coil spring for blocking the propagation of electromagnetic waves therepast. The canted-coil spring includes a plurality of individual coils canted along a centerline thereof. A groove is provided for supporting the coil spring in a position enabling loading of the coil spring along a selected direction. The groove is provided with a selected surface for causing individual coils to always turn in a selected angular direction in order to control electromagnetic shielding effectiveness of the coil spring.

10 Claims, 4 Drawing Sheets

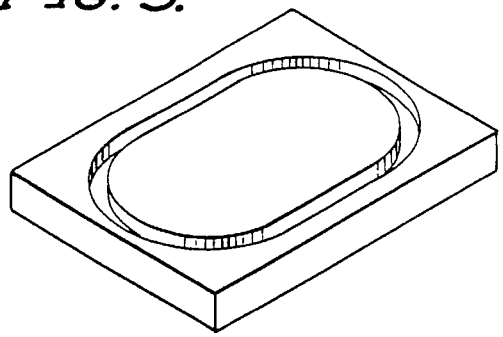
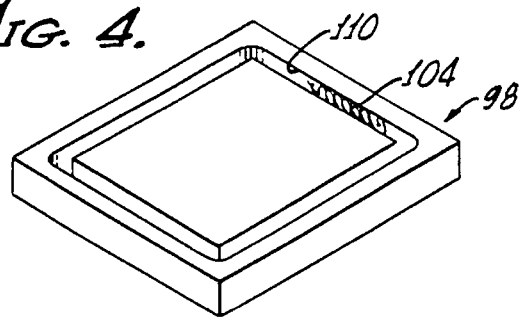
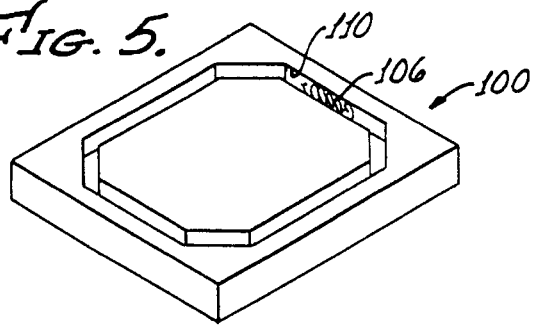
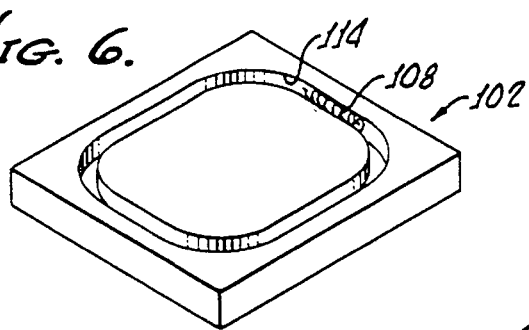
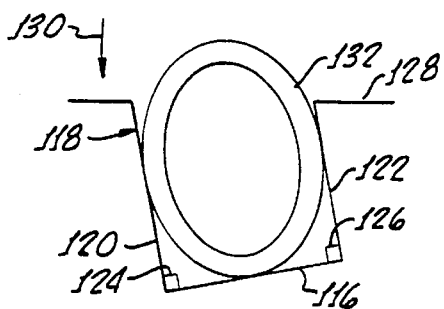
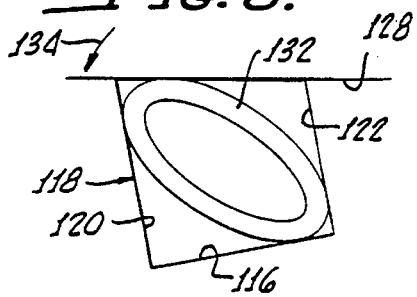
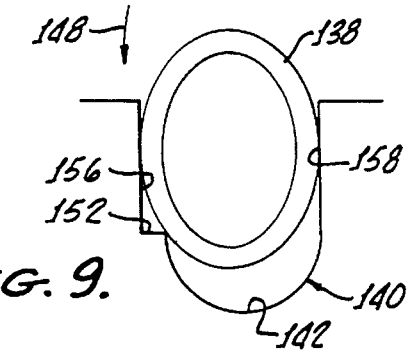
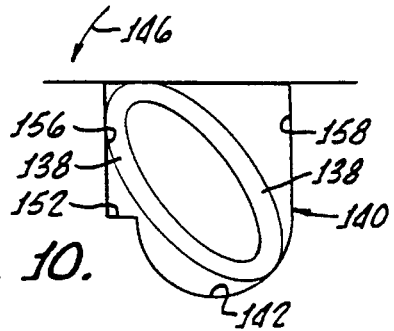

1

GASKET ASSEMBLY FOR SEALING ELECTROMAGNETIC WAVES

This application is a division of application Ser. No. 08/074,384, filed Jun. 11, 1993, now U.S. Pat. No. 5,474,309.

The present invention generally relates to canted-coil springs and seals and, more particularly, relates to canted-coil springs retained in a cavity with interference between the spring coils and the cavity to retain the spring in a selected orientation for subsequent loading of the spring. Orienting the spring for major or minor axis loading enables a specific selected resilient, or load-deflection, characteristic in response to the subsequent loading of the springs.

A description of the loading characteristics of various canted-coil springs is found in U.S. Pat. Nos. 4,655,462; 4,826,144; 4,830,344; 4,876,781; 4,893,795; 4,907,788; 4,915,366; 4,934,666; 4,961,253; 4,964,204; 4,974,821; 5,072,070; 5,079,388; 5,108,078; 5,117,066; 5,134,244; 5,160,122; 5,161,806; and 5,203,849. All of these patents have been issued to Peter J. Balsells.

It should be appreciated that cavities for supporting springs, as hereinafter discussed, may be linear or continuous with a desired shape, be it circular or otherwise. For use in circular cavities, a spring may have end coils welded together to form a garter-type canted-coil spring.

Of particular interest are springs and cavities, or grooves, useful as a gasket assembly for environmental sealing, providing electrical conductivity, thermal dissipation and electromagnetic shielding.

Electromagnetic energy as used herein is a generic term including the full spectrum of electromagnetic energy frequencies, and specifically as used hereinafter, electromagnetic interference (EMI) and radio frequency interference (RFI) may be used interchangeably, with both referring to interference caused by unwanted electromagnetic energy or radio frequency energy entering a designated piece of equipment. In general, the ability to shield a component from egress or ingress from electromagnetic energy is often called shield effectiveness.

A factor of prime importance in electromagnetic shielding is the frequency of the electromagnetic energy or the wavelength thereof. It is known that all electromagnetic waves consist of two essential components: a magnetic field and an electric field. These two fields are perpendicular to each other, and the direction of wave propagation is at right angles to the plane containing these two components. The relative magnitude between the magnetic (H) field and the electric (E) field depends on how far away the wave is from its source and on the nature of the generating source itself. The ratio of E to H is called the wave impedance, $Z_w$.

Thus, it can be seen that shield effectiveness for a particular gasket may differ, depending on whether the electromagnetic energy is generated in associated equipment or in equipment remote from the gasket.

If the source contains a large current flow compared to its potential, such as may be generated by a loop, a transformer, or power lines, it is called a current, magnetic, or low impedance source, having a small E to H value. On the other hand, if the source operates at a high voltage, and only a small amount of current flow, the source impedance is said to be high, and the wave is commonly referred to as an electric field.

It is important to realize that at very large distances from a source, the ratio of E to H is equal for either wave, regardless of its orientation. When this occurs, the wave is said to be a plane wave, and the wave impedance is equal to 377 ohms, which is the intrinsic impedance of free space.

It is known that metals have an intrinsic impedance that approaches zero as conductivity approaches infinity. Because of the great difference between the intrinsic impedance of metals and the intrinsic impedance of free space, waves generated from sources remote from the metal receptor will have most of the energy reflected therefrom and very little will be transmitted therepast. This, of course, is not true for magnetic or low impedance fields in which less energy is reflected, and more is absorbed thereby making it more difficult to shield against magnetic fields. Because magnetic shields have less than infinite conductivity, part of the field is transmitted across the boundary which is dependent upon the thickness of the metallic shield.

A far greater factor in shield effectiveness is the presence of openings or gaps in the shield. A gap or opening in the shield will allow electromagnetic fields to radiate through the shield unless the current continuity can be preserved across the gaps. Therefore, the function of an EMI gasket is to preserve the continuity of current flow in the shield.

The importance of the gap is, of course, dependent upon the frequency of the impinging electromagnetic energy. For example, electromagnetic energy having frequency of one GHz has a wavelength of approximately 11.6 inches, while electromagnetic energy of 100 GHz has a wavelength approaching 0.12 inches. As a general rule, for effective shielding in commercial use, the opening size should be less than the wavelength of the electromagnetic energy divided by 20 and for avionics use, the opening size should be less than 1/50th of the wavelength of the electromagnetic energy.

Other factors bearing directly on the gap size, and therefore shield effectiveness, are the surface finish of mating parts to be sealed and the ability of the shield material to withstand environmental changes with no or little change in conductivity due to corrosion galvanic action, etc. The ability of the gasket to provide dimensional stability with a constant load throughout the life of the gasket between the mating parts is important in order to prevent changes in the continuity of the gasket and to prevent the opening of gaps therein, which may be unacceptable in terms of shield effectiveness.

The gasket assembly of the present invention provides an effective electromagnetic shield through the use of a canted-coil spring with closely spaced coils that deflect upon loading, for providing a nearly constant force between mating points and/or surfaces, in order to assure a high degree of conductivity, and therefore a high shield effectiveness, within useful temperature and cycling requirements. Proper deflection orientation is mandated by a groove configuration.

In addition, the gasket assembly of the present invention provides sufficient flexibility to make up for variations that may occur due to torquing, eccentricities, irregularities and other variables, and still maintain the required loading and open low area for effective shielding from very low frequencies to extremely high frequencies.

The gasket assembly of the present invention also finds use in certain applications as an electrical conductor between two adjacent surfaces, as a heat sink for carrying and dissipating thermal energy and as an environmental seal.

SUMMARY OF THE INVENTION

In accordance with the present invention, a gasket assembly for sealing electromagnetic waves generally includes coil spring means for blocking the propagation of electromagnetic waves therepast with the coil spring means being formed from a plurality of individual coils canted along a centerline thereof. Groove means are provided for supporting the coil spring means in a position enabling loading of the coil spring means along a selected direction.

Importantly, the groove means, in accordance with the present invention, includes surface means for causing the individual coils to always turn in a selected angular direction in order to control electrical conductivity, thermal dissipation and environmental sealing and electromagnetic shielding effectiveness of the coil spring means. The surfaces of the groove means provide a unique structure for ensuring proper orientation of the coil spring means for loading. A great number of canted-coil design configurations has been utilized for controlling spring characteristics, as can be seen from the hereinabove-referenced patents; in fact, all of the hereinabove-referenced U.S. patents are to be incorporated herein, including drawings and specifications, for the purpose of teaching not only spring structure of the type suitable for use in the present invention, but also for an explanation of the electromagnetic shielding characteristics of such springs. Accordingly, repeat of such description is not set forth herein.

However, none of the cited references address the utilization of groove surfaces for causing the individual coil springs to predictably turn in a selected angular direction.

In one embodiment of the present invention, the surface means includes a bottom grooved surface disposed aslant to the loading direction. When the individual coil means are joined to form a continuous coil spring means, a loading direction is axial to the coil spring means, i.e., along the axis of the coil spring means, which may have a circular configuration, elliptical configuration or other rectangular pattern.

The surface means may further include generally parallel side grooves adjoining the bottom groove surface and disposed parallel to the loading direction.

In an alternative embodiment of the present invention, the side groove surfaces adjoining the bottom groove may be disposed at right angles therewith. Thus, in this embodiment, the side groove surfaces are also aslant to the loading direction.

Another embodiment of the present invention includes surface means which comprises an arcuate bottom surface and generally parallel side groove surfaces adjoining the arcuate bottom surface. To assure predictable turning of the coil spring means, when disposed in the groove means, the arcuate bottom surface may further include a step portion adjoining one of the generally parallel side groove surfaces.

In accordance with the present invention, a groove width, defined by a distance between the generally parallel side surfaces, is generally smaller than a coil height measured along a minor axis of the individual coils. This is an important feature which enables the spring to be assembled into the groove and retained therein prior to loading of the spring. Hence the spring may be assembled into a groove that can be in any position: vertical, horizontal, upside down, etc., that would otherwise not be possible.

Preferably, the individual coils are oval in shape with each having a major and a minor axis. Thus, the individual coils are loaded axially along the major axis but deflect along the minor axis and, when loaded, provide for shielding electromagnetic waves, provide current-carrying capabilities, thermoconductivity and an environmental seal.

In addition, the coils may be filled with an elastomer, which is either solid or hollow, in order to provide further electromagnetic shielding, current-carrying capability, thermal dissipation and environmental sealing.

BRIEF DESCRIPTION OF THE DRAWINGS

The advantages and features of the present invention will be better understood by the following description when considered in conjunction with the accompanying drawings in which:

FIG. 3 is an elliptical embodiment of the present invention;

FIGS. 4, 5 and 6 are various rectangular embodiments of the present invention;

FIG. 7 is an alternative embodiment of the present invention, showing a coil spring in a groove having a slanted bottom with perpendicular sidewalls;

FIG. 8 is a view similar to that shown in FIG. 7 with the coil in a loaded position;

FIG. 9 is another embodiment of the present invention showing a groove having an angular bottom surface with an unloaded coil therein; and FIG. 10 is a view similar to FIG. 9 with the spring in a loaded position.

DETAILED DESCRIPTION

Figure 1:
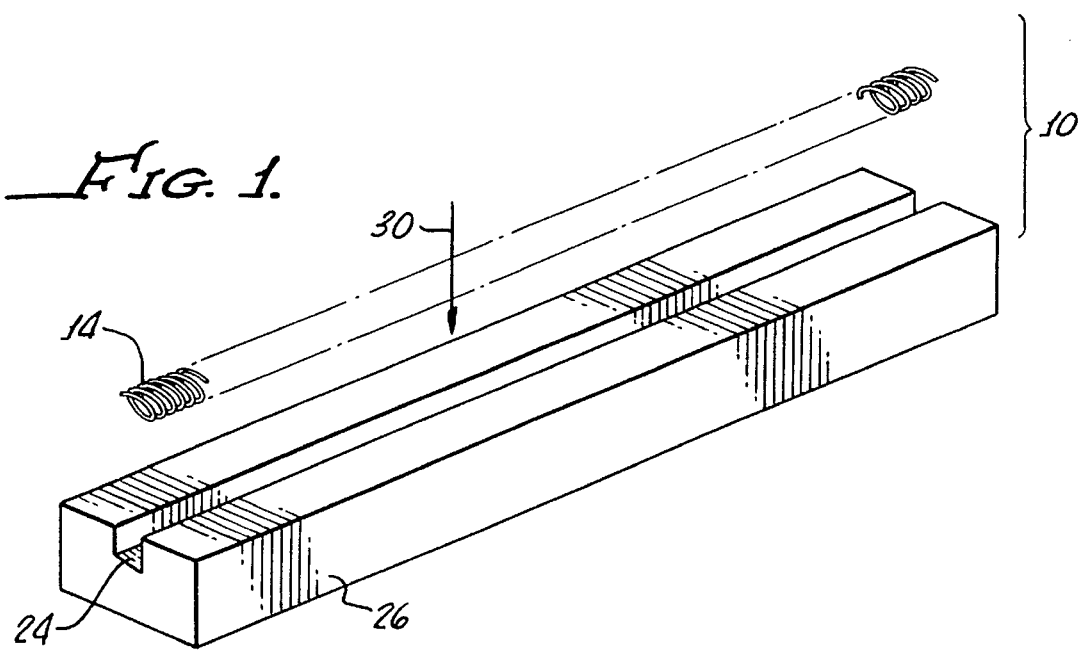
FIG. 1 is a linear embodiment of the present invention in which a spring length is disposed within a longitudinal groove.

As hereinafter described, spring assemblies 10, 12 may be made in various configurations, such as a linear configuration 10 (shown in FIG. 1) and a continuous coil configuration 12 (shown in FIG. 2). Coil spring 14, 16, when loaded, assumes a typical force vs. deflection curve for canted-coil springs, in which the load remains relatively constant within the working deflection and, upon reaching an initial butt point, where the coils begin to butt, the load increases very sharply with a small inflection until it reaches a final butt point. This characteristic is explained in detail in the hereinabove-referenced U.S. issued patents.

All of the figures to be described hereinafter illustrate the coil spring having a spacing 20 between coils 22 (see FIGS. 1A–1E). However, the coil spring 10 may be loaded to within a butt point range to provide a smaller aperture and greater shielding effectiveness. The relationship between the spacing 20 and the electromagnetic shielding is also discussed in greater detail in the hereinabove-referenced U.S. issued patents.

In FIG. 1, a gasket assembly 10 generally includes coil spring 14, which provides means for blocking propagation of electromagnetic waves therepast, and a groove 24 in any suitable host material 26, which provides a means for supporting the coil spring 14 in a position enabling loading of the coil spring along a selected direction indicated by an arrow 30. As shown in FIGS. 1A–1E, the coil spring 14 is formed from a plurality of individual coils 32, which are preferably oval in shape, having a major axis 36 and a minor axis 38. As best shown in FIGS. 1C and 1E, the coils 32 are canted along a centerline 42 thereof.

It is to be appreciated that in order to control electrical conductivity, thermal dissipation and environmental sealing and electromagnetic shielding effectiveness of the coil spring 14, 16 the coils 22 and the spacing 20 must be carefully controlled. This control is provided in accordance with the present invention by the groove 24 as herein described.

Importantly, the groove 24 includes a bottom surface 48 which is disposed aslant from the loading direction 30. This provides a means for causing the individual coils 32 to always turn in a selected angular direction, as shown in FIG. 1B and indicated by the arrow 50.

Coil 32, turning upon loading, causes closure of the opening 20 and a narrowing of the aperture 52 (see FIG. 1E) in order to control electromagnetic shielding effectiveness of the coil spring assembly 10. Reference is made to the hereinabove-cited issued U.S. patents (particularly U.S. Pat. Nos. 4,934,666; 5,079,388; and 5,134,244) for a description of such electromagnetic shielding properties.

The bottom surface 48 ensures the proper rotation of the spring as it is loaded along the direction 30 within the groove 24.

Figure 1A:
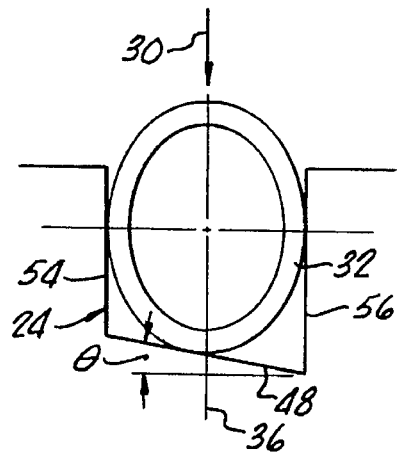
FIG. 1A is a cross-sectional view of the embodiment shown in FIG. 1, showing an unloaded individual coil within a groove.
Figure 1B:
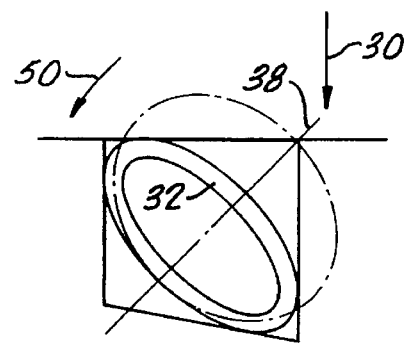
FIG. 1B is a cross-sectional view of the embodiment shown in FIG. 1, showing the individual coil in a loaded position within the groove.
Figure 1C:
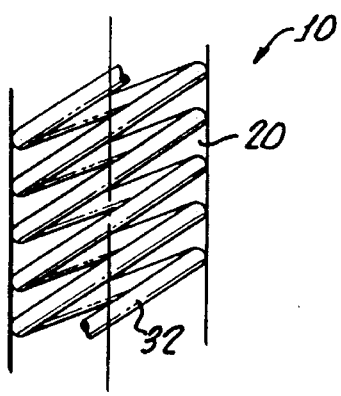
FIG. 1C is a top view of the coil spring within the groove in a free position as shown in FIG. 1A.
Figure 1D:
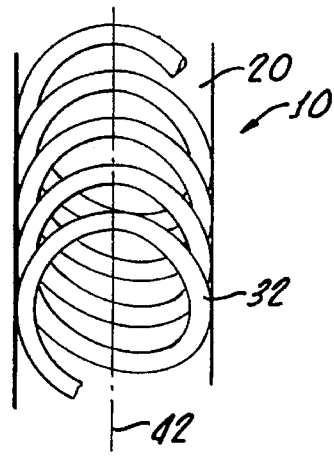
FIG. 1D is a top view of the coil spring shown in a loaded position as in FIG. 1B.
Figure 1E:
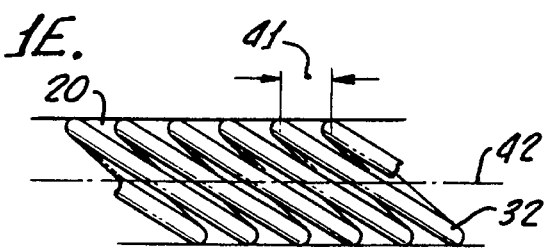
FIG. 1E is a side view of the longitudinal coil spring extending to an unloaded position (dashed line), also showing a loaded position (solid line) of the coil spring.

As shown in FIGS. 1A and 1B, a groove 24 includes sidewalls 54, 56 which adjoin the bottom surface 48 and are disposed parallel to the loading direction 30. This positions the bottom surface 48 at an angle Θ to the sidewalls 54, 56 and, in accordance with the present invention, Θ may vary from slightly more than about 0° to slightly less than about 90°, but preferably between about 10° to about 30° in order to control electromagnetic shielding, electrical conductivity, thermal dissipation and environmental sealing.

Figure 2:
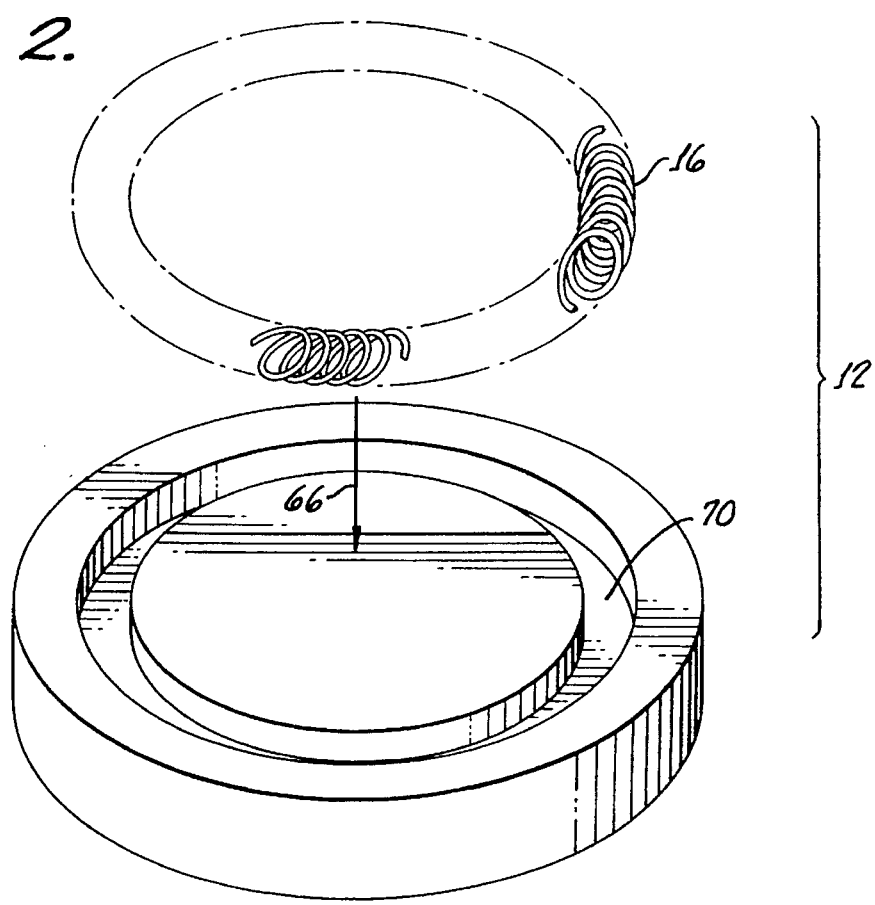
FIG. 2 is a continuous coil spring configuration in accordance with the present invention, showing a circular spring and a circular groove therefor.

In FIG. 2, the alternative embodiment 12, in accordance with the present invention, utilizes a continuous spring 16 in which individual coils 60 are interconnected to form the garter-type spring 16. FIGS. 2A through 2E correspond to FIGS. 1A through 1E, showing the coils 60 in an unloaded position, FIG. 2A, in a loaded position, FIG. 2B, along with illustrations of the coils 60 and aperture 62.

In this configuration, the loading direction, as indicated by arrow 66, is axial to the coil spring.

A circular groove 70, or an elliptical groove 70' (see FIG. 3), may be provided, which includes a bottom surface 72 and sidewalls 74, 76, configured similar to the bottom 48 and sidewalls 54, 56 of groove 24 for causing the coils 60 to rotate in the direction of arrow 78 in a consistent manner when loaded, in the direction of arrow 66, which is axial to the coil spring 16. While the axial direction 80 is along a major axis 82, loading of coil 60 is primarily along a minor axis 84, as hereinbefore shown in FIG. 1B in connection with the coils 32. When loaded, the primary deflection 88 is along the minor axis 84.

Figure 2A:
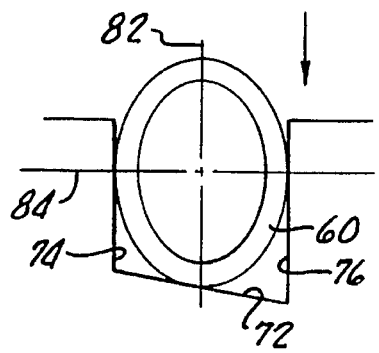
FIG. 2A is a cross-sectional view of the embodiment shown in FIG. 2 showing an unloaded spring within the groove.
Figure 2B:
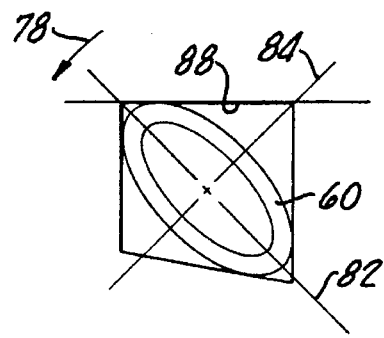
FIG. 2B is a cross-sectional view of the embodiment shown in FIG. 2 showing the spring in a loaded position within the groove.
Figure 2C:
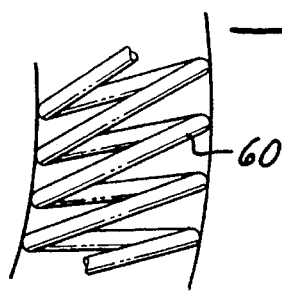
FIG. 2C is a top view of the spring in an unloaded position within the circular groove.
Figure 2D:
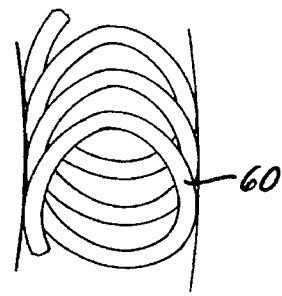
FIG. 2D is a top view of the loaded spring within the circular groove.
Figure 2E:
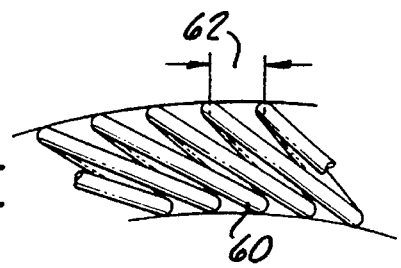
FIG. 2E is a view similar to FIG. 1E showing a side view of the circular spring.
Figure 2F:
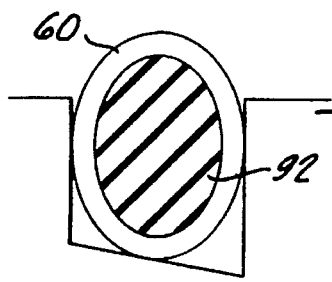
FIGS. 2F, 2G, 2H and 2I are alternative embodiments of the present invention, corresponding to the spring shown in FIGS. 2A and 2B, but filled with an elastomer.
Figure 2G:
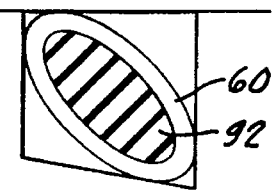
Figure 2H:
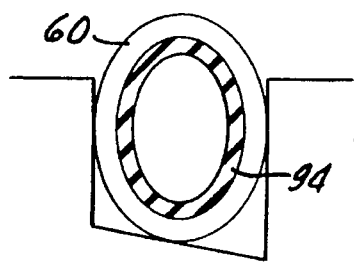
Figure 2I:
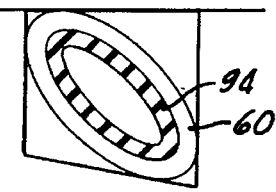

The coils 60 may be filled with a solid elastomer 92 (as shown in FIGS. 2F and 2G) or a hollow elastomer 94 (as shown in FIGS. 2H and 2I) in order to alter the loading characteristics of the spring. The use of such elastomers in combination with canted-coil springs is described in U.S. Pat. Nos. 5,160,122; 5,203,849; and 5,091,606 as hereinabove referenced.

FIGS. 4, 5 and 6 illustrate further alternative embodiments 98, 100, 102 which show springs 104, 106, 108 in grooves 110, 112, 114, respectively. Embodiment 98 illustrates rectangular groove design having sharp edge corners. Embodiment 100 shows a rectangular groove design having a chamfer edge groove design. Embodiment 108 shows a rectangular groove design having a radius edge. The corresponding arrangement of the springs 104, 106, 108 within the grooves 110, 112, 114 and the turning thereof upon loading (not shown) by interior surfaces (not shown) of the grooves 110, 112, 114 is similar to and represented by the embodiments 10, 12 shown in FIGS. 1 through 1E and 2 through 2E.

In FIGS. 7 and 8, there is shown an alternative groove 118 arrangement for any of the hereinabove-described springs 14, 16, 104, 106, 108, which includes bottom surface 116 with adjoining sidewalls 118, 120, disposed at right angles 124, 126 to the bottom 116 and at an angle to adjoining surface 128. In this instance, the sidewalls 120, 122 are aslant to a loading direction (arrow 130) by an angle ø. This results in a bottom surface which is also aslant to the loading direction 130 and provides for a reliable rotation of a coil 132 in the direction of arrow 134.

FIGS. 9 and 10 show an individual coil 138 disposed in a groove 140 which includes arcuate bottom portion 142 for rotating the coil 138 in the direction indicated by arrow 146 upon loading in a direction indicated by arrow 148. To ensure proper rotation of the coil upon loading, a step portion 152 may be provided which adjoins a sidewall 156. A second sidewall 158 adjoins the arcuate surface 142 in a continuous manner, as shown in FIGS. 9 and 10.

Although there has been hereinabove described a specific embodiment of a gasket assembly for sealing electromagnetic waves in accordance with the present invention, for the purpose of illustrating the manner in which the invention may be used to advantage, it should be appreciated that the invention is not limited thereto. Accordingly, any and all modifications, variations, or equivalent arrangements which may occur to those skilled in the art, should be considered to be within the scope of the present invention as defined in the appended claims.

What is claimed is:

1. A gasket assembly for sealing electromagnetic waves, said gasket assembly comprising:

coil spring means for blocking the propagation of electromagnetic waves therepast, said coil spring means comprising a plurality of individual coils canted along a centerline thereof; and groove means for supporting said coil spring means in a position enabling loading of the coil spring means along a selected direction, said groove means comprising surface means for causing the individual coils to always turn in a selected angular direction in order to control electromagnetic shielding effectiveness of the coil spring means, said groove means comprising a bottom grove surface disposed aslant to said loading direction and generally parallel side grove surfaces adjoining said bottom groove surface and disposed at right angles therewith.

2. The gasket assembly according to claim 1 wherein a groove width, defined by a distance between said generally parallel side surfaces, is smaller than coil height, measured along a minor axis of the individual coils.

3. The gasket assembly according to claim 1 wherein said coil spring means is filled with an elastomer.

4. The gasket assembly according to claim 1 wherein said groove means is linear.

5. The gasket assembly according to claim 4 wherein said coil spring means is filled with an elastomer.

6. An axially loadable gasket assembly for sealing electromagnetic waves, said gasket assembly comprising:

coil spring means for blocking the propagation of electromagnetic waves therepast, said coil spring means comprising a plurality of individual coils canted along a centerline thereof; and groove means for supporting said coil spring means in a position enabling axial loading of the coil spring means, said groove means comprising surface means for causing individual coils to always turn in a selected angular direction in order to control electromagnetic shielding effectiveness of the coil spring means, said groove means comprising a bottom groove surface disposed aslant to said loading direction and sidewalls disposed at an angle to an adjoining surface.

7. The gasket assembly according to claim 6 wherein said surface means further comprises generally parallel side groove surfaces adjoining said bottom groove surface and disposed at right angles therewith.

8. An axially loadable gasket assembly for sealing electromagnetic waves, said gasket assembly comprising:

continuous coil spring means for blocking the propagation of electromagnetic waves therepast, said coil spring means comprising a plurality of individual coils canted along a centerline thereof, each individual coil being oval and having a major and a minor axis; and groove means for supporting said coil spring means in a position enabling loading of the coil spring means along the major axis of the individual coils and deflection of the individual coils along the minor axis thereof, said groove means comprising surface means for causing individual coils to always turn in a selected angular direction in order to control electromagnetic shielding effectiveness if the coil spring means, said groove means comprising a bottom groove surface disposed aslant to said loading direction and sidewalls disposed at an angle to an adjoining surface.

9. The gasket assembly according to claim 8 wherein said surface means further comprises generally parallel side groove surfaces adjoining said bottom groove surface and disposed at right angles therewith.

10. The gasket assembly according to claim 8 wherein said coil spring means is filled with an elastomer.

* * * * *